United States Patent
Motoki et al.

[11] Patent Number: 5,962,875
[45] Date of Patent: Oct. 5, 1999

[54] LIGHT EMITTING DEVICE, WAFER FOR LIGHT EMITTING DEVICE, AND METHOD OF PREPARING THE SAME

[75] Inventors: Kensaku Motoki; Mitsuru Shimazu; Yoshiki Miura, all of Hyogo, Japan

[73] Assignee: Sumitomo Electric Industries, Ltd., Osaka, Japan

[21] Appl. No.: 09/056,519

[22] Filed: Apr. 7, 1998

Related U.S. Application Data

[62] Division of application No. 08/864,417, May 28, 1997, Pat. No. 5,834,325.

[30] Foreign Application Priority Data

May 31, 1996 [JP] Japan .................................. 8-137332
May 13, 1997 [JP] Japan .................................. 9-122378

[51] Int. Cl.[6] ........................................... H01L 33/00
[52] U.S. Cl. ................................. 257/103; 257/96
[58] Field of Search .................... 438/22, 46, 29, 438/35, 978, 43, 977; 257/13, 97, 163, 96

[56] References Cited

U.S. PATENT DOCUMENTS

| | | | |
|---|---|---|---|
| 4,912,532 | 3/1990 | Cook et al. ............................ | 357/1.6 |
| 5,038,356 | 8/1991 | Botez et al. ........................... | 438/29 |
| 5,122,845 | 6/1992 | Manabe et al. ....................... | 257/103 |
| 5,218,216 | 6/1993 | Manabe et al. ....................... | 257/103 |
| 5,278,433 | 1/1994 | Manabe et al. ....................... | 257/103 |
| 5,281,830 | 1/1994 | Kotaki et al. ......................... | 257/86 |
| 5,290,393 | 3/1994 | Nakamura ............................. | 438/46 |
| 5,369,289 | 11/1994 | Tamaki et al. ........................ | 257/99 |
| 5,408,120 | 4/1995 | Manabe et al. ....................... | 257/431 |
| 5,432,808 | 7/1995 | Hatano et al. ........................ | 372/45 |
| 5,496,766 | 3/1996 | Amano et al. ........................ | 438/79 |
| 5,578,839 | 11/1996 | Nakamura et al. ................... | 257/96 |
| 5,665,986 | 9/1997 | Miura et al. .......................... | 257/96 |
| 5,679,152 | 10/1997 | Tisehler et al. ....................... | 117/1 |
| 5,739,552 | 4/1998 | Kimura et al. ........................ | 297/89 |
| 5,795,798 | 8/1998 | Mishra et al. ......................... | 438/35 |
| 5,814,533 | 9/1998 | Shakuda ................................. | 438/46 |
| 5,880,485 | 3/1999 | Marx et al. ............................ | 257/94 |

FOREIGN PATENT DOCUMENTS 360140771 7/1985 Japan ..................................... 438/287
8-181070 7/1996 Japan .

*Primary Examiner*—Savitri Mulpuri
*Attorney, Agent, or Firm*—W. F. Fasse; W. G. Fasse

[57] ABSTRACT

A light emitting device having higher blue luminance is obtained. A gallium nitride compound layer is formed on a GaAs substrate, and thereafter the GaAs substrate is at least partially removed for forming the light emitting device. Due to the removal of the GaAs substrate, the quantity of light absorption is reduced as compared with the case of leaving the overall GaAs substrate. Thus, a light emitting device having high blue luminance is obtained.

19 Claims, 4 Drawing Sheets

LIGHT EMITTING DEVICE, WAFER FOR LIGHT EMITTING DEVICE, AND METHOD OF PREPARING THE SAME

CROSS-REFERENCE TO RELATED APPLICATION

This application is a Divisional of U.S. application Ser. No. 08/864,417, filed May 28, 1997, now U.S. Pat. No. 5,834,325.

BACKGROUND OF THE INVENTION

1. Field of the Invention

The present invention relates to a light emitting device, a wafer for a light emitting device, and a method of preparing the same, and more specifically, it relates to a light emitting device looking blue or blue-green, a wafer for a light emitting device and a method of preparing the same.

2. Description of the Background Art

In recent years, GaN light emitting devices are watched with interest. Among such light emitting devices, a device employing a sapphire substrate is now being industrialized in particular. However, it is difficult to form a metal electrode on a lower portion of the sapphire substrate which is an insulating substrate. Therefore, a nitride mixed crystal must be extracted from an upper portion of the sapphire substrate by etching for forming a metal electrode, leading to complicated preparation steps and a high cost.

Due to there being no cleavage of the sapphire substrate, further, a reflector consisting of a cleavage plane cannot be formed in application to a laser diode. To this end, there has generally been proposed a light emitting device employing a gallium arsenide (GaAs) substrate in place of the sapphire substrate having such disadvantages. For example, Japanese Patent Laying-Open No. 8-181070 (1996) discloses such a light emitting device.

However, such a light emitting device employing a GaAs substrate has large absorption for light of a shorter wavelength corresponding to blue. Therefore, light passing through the GaAs substrate is absorbed to disadvantageously reduce the luminance of the overall light emitting device. In general, factors deciding the luminance of a light emitting device include light extraction efficiency in the case of extracting light from a light extraction port of the light emitting device into the air. This light extraction efficiency is decided by factors based on light reflection in the crystal and absorption of the light into the crystal. When a GaAs substrate is employed, however, a light absorption coefficient ($cm^{-1}$) which is the latter factor exceeds 10,000 with respect to light having energy exceeding 1.48 eV, i.e., in excess of 100 times that of a general sapphire substrate. Therefore, the GaAs substrate disadvantageously presents larger absorption as compared with the sapphire substrate.

SUMMARY OF THE INVENTION

An object of the present invention is to provide a light emitting device and a wafer for a light emitting device having higher luminance.

Another object of the present invention is to readily prepare a wafer for a light emitting device having higher luminance in a method of preparing the wafer for a light emitting device.

In a method of preparing a wafer for a light emitting device according to an aspect of the present invention, a gallium nitride compound layer is formed on a gallium arsenide (GaAs) substrate. After the formation of the gallium nitride compound layer, the gallium arsenide substrate is at least partially removed. Due to such at least partial removal of the gallium arsenide substrate, the quantity of light absorbed by the gallium arsenide substrate is reduced as compared with the case of entirely leaving the gallium arsenide substrate. Consequently, a wafer for a light emitting device having higher luminance can be readily prepared.

The gallium nitride compound layer may include a GaN buffer layer and a GaN epitaxial layer, so that the GaAs substrate is entirely removed. In this case, the total thickness of the GaN buffer layer and the GaN epitaxial layer is preferably set to be at least 70 $\mu$m and not more than 400 $\mu$m, and the GaN buffer layer and the GaN epitaxial layer form a GaN substrate.

The gallium arsenide substrate may be removed by at least one of machine work removal means, removal means through reactive ion etching employing chlorine ($Cl_2$) gas, removal means through wet etching employing ammonia and hydrogen peroxide, and decomposition removal means in a high-temperature atmosphere of hydrogen chloride (HCl) gas. Further, the gallium nitride compound layer may include a gallium nitride (GaN) buffer layer, a first GaN epitaxial layer, a first aluminum gallium nitride (AlGaN) epitaxial layer, a luminescent layer containing indium gallium nitride (InGaN), a second aluminum gallium nitride (AlGaN) epitaxial layer, and a second GaN epitaxial layer. In this case, the gallium nitride compound layer may have a thickness of at least 70 $\mu$m and not more than 200 $\mu$m, so that the gallium arsenide substrate is entirely removed. Alternatively, the gallium nitride compound layer may be formed to have a thickness of at least 1 $\mu$m and not more than 70 $\mu$m, so that the gallium arsenide substrate is partially removed.

The step of forming the gallium nitride layer may include steps of forming a stripe pattern consisting of an insulating film on the GaAs substrate, thereafter forming a buffer layer consisting of either GaN or AlN on the GaAs substrate and the stripe pattern, and forming a GaN epitaxial layer on the buffer layer, while the step of at least partially removing the GaAs substrate may include a step of entirely removing the GaAs substrate. Due to the employment of the stripe pattern consisting of the insulating film, the formed buffer layer and GaN epitaxial layer can be improved in crystallinity. The insulating film is preferably prepared from either silicon dioxide or silicon nitride. The insulating film preferably has a width of at least 3 $\mu$m and not more than 20 $\mu$m, and a thickness of at least 0.05 $\mu$m and not more than 0.5 $\mu$m.

A wafer for a light emitting device according to another aspect of the present invention comprises a GaN substrate including a GaN buffer layer and a GaN epitaxial layer. The total thickness of the GaN buffer layer and the GaN epitaxial layer is at least 70 $\mu$m and not more than 400 $\mu$m. In the wafer for a light emitting device according to this aspect, the GaN substrate including the GaN buffer layer and the GaN epitaxial layer can be employed for various applications. For example, the GaN substrate is effective as a substrate for a laser diode. Because there is no other type of substrate under the GaN buffer layer, a reflecting surface formed by cleavage on a chip end surface of a laser unit can be extremely smoothed, whereby the laser characteristics can be improved.

A light emitting device according to still another aspect of the present invention comprises a gallium arsenide substrate and a gallium nitride compound layer. The gallium arsenide substrate has a major surface. The gallium nitride compound layer is formed on the major surface of the gallium arsenide substrate, and includes a blue or blue-green luminescent layer. This gallium nitride compound layer includes a gallium nitride buffer layer, a first GaN epitaxial layer, a first aluminum gallium nitride epitaxial layer, a luminescent layer containing indium gallium nitride, a second aluminum gallium nitride epitaxial layer, and a second GaN epitaxial layer. Further, the gallium arsenide substrate is partially removed to expose a surface of the gallium nitride compound layer. In the light emitting device according to this aspect, the surface of the gallium nitride compound layer is exposed by partially removing the gallium arsenide substrate, whereby the quantity of absorption of shorter-wavelength light corresponding to blue is reduced as compared with the case of entirely leaving the gallium arsenide substrate. Thus, a light emitting device having higher luminance can be obtained. In this case, the thickness of the gallium nitride compound layer forming the light emitting device is preferably set to be at least 1 $\mu$m and not more than 70 $\mu$m.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention are now described with reference to the drawings.

(First Embodiment)

Figure 1A:
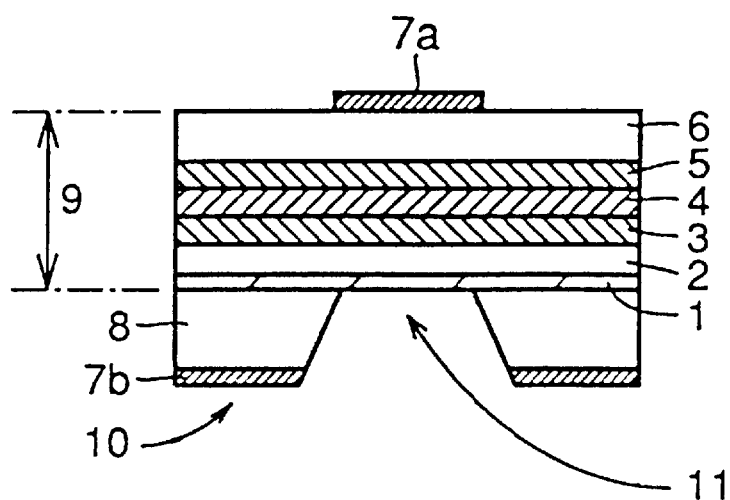
FIG. 1A is a sectional view showing a light emitting device according to a first embodiment of the present invention.
Figure 1B:
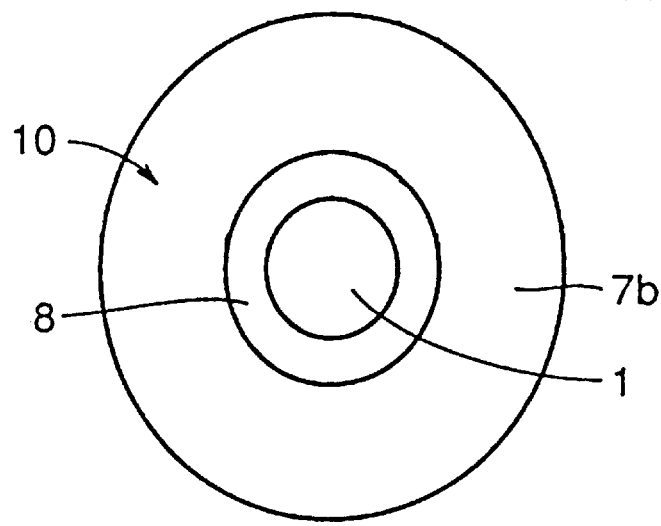
FIG. 1B is a bottom plan view of the light emitting device shown in FIG. 1A.

Referring to FIGS. 1A and 1B showing a light emitting device according to a first embodiment of the present invention, a nitride mixed crystal layer 9 of a gallium nitride compound is formed on a surface of a GaAs substrate 8, and a metal electrode 7b is formed on another surface of the GaAs substrate 8. Further, a metal electrode 7a is formed on an upper surface of the nitride mixed crystal layer 9.

The nitride mixed crystal layer 9 includes six layers of a GaN buffer layer 1, an n-type GaN epitaxial layer 2, an n-type AlGaN epitaxial layer 3, an InGaN luminescent layer 4, a P-type AlGaN epitaxial layer 5, and a p-type GaN epitaxial layer 6. This nitride mixed crystal layer 9 has such a double heterostructure that both surfaces of the InGaN luminescent layer 4 are held between the AlGaN epitaxial layers 3 and 5 serving as cladding layers. Further, the n- and p-type GaN epitaxial layers 2 and 6 serve as protective films in an etching step. The n- and p-type GaN epitaxial layers 2 and 6 are superior in corrosion resistance to the n- and p-type AlGaN epitaxial layers 3 and 5 serving as cladding layers.

According to the first embodiment, the GaAs substrate 8 is so partially removed in an area 11 as to expose a surface of the GaN buffer layer 1 on the removed portion. The metal electrode 7b is formed on a surface of an unremoved portion 10 of the GaAs substrate 8.

Due to the partial removal of the GaAs substrate 8 in the first embodiment, the quantity of light absorbed by the GaAs substrate 8 is reduced as compared with a conventional light emitting device provided with such a GaAs substrate on the overall surface. Thus, a light emitting device having higher luminance as compared with the prior art can be provided.

According to the first embodiment, the thickness of the nitride mixed crystal layer 9 is set to be at least 1 $\mu$m and not more than 70 $\mu$m,. The nitride mixed crystal layer 9 is thus formed in a relatively small thickness, since the strength can be maintained by the unremoved portion 10 of the GaAs substrate 8. According to the first embodiment, therefore, it is possible to provide a light emitting device employing the relatively thin nitride mixed crystal layer 9 at a low cost. The unremoved portion 10 of the GaAs substrate 8 must be formed in the minimum area with no hindrance on the luminescent portion.

Except the GaN epitaxial layers 2 and 6, each layer forming the nitride mixed crystal layer 9 has a small thickness of 0.1 to 0.2 $\mu$m. In practice, therefore, the thickness of the nitride mixed crystal layer 9 is substantially identical to the total thickness of the GaN epitaxial layers 2 and 6. In order to increase the thickness of the nitride mixed crystal layer 9, therefore, the thicknesses of the GaN epitaxial layers 2 and 6 may be increased. The thicknesses of the n- and p-type AlGaN epitaxial layers 3 and 5 serving as cladding layers for holding the InGaN luminescent layer 4 may also be effectively increased for increasing the strength.

Figure 2:
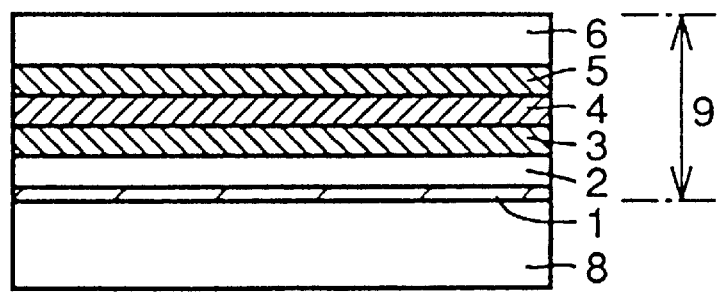
FIG. 2 is a sectional view for illustrating a process of preparing an epitaxial wafer employed for a light emitting device according to the first or second embodiment of the present invention.
Figure 6:
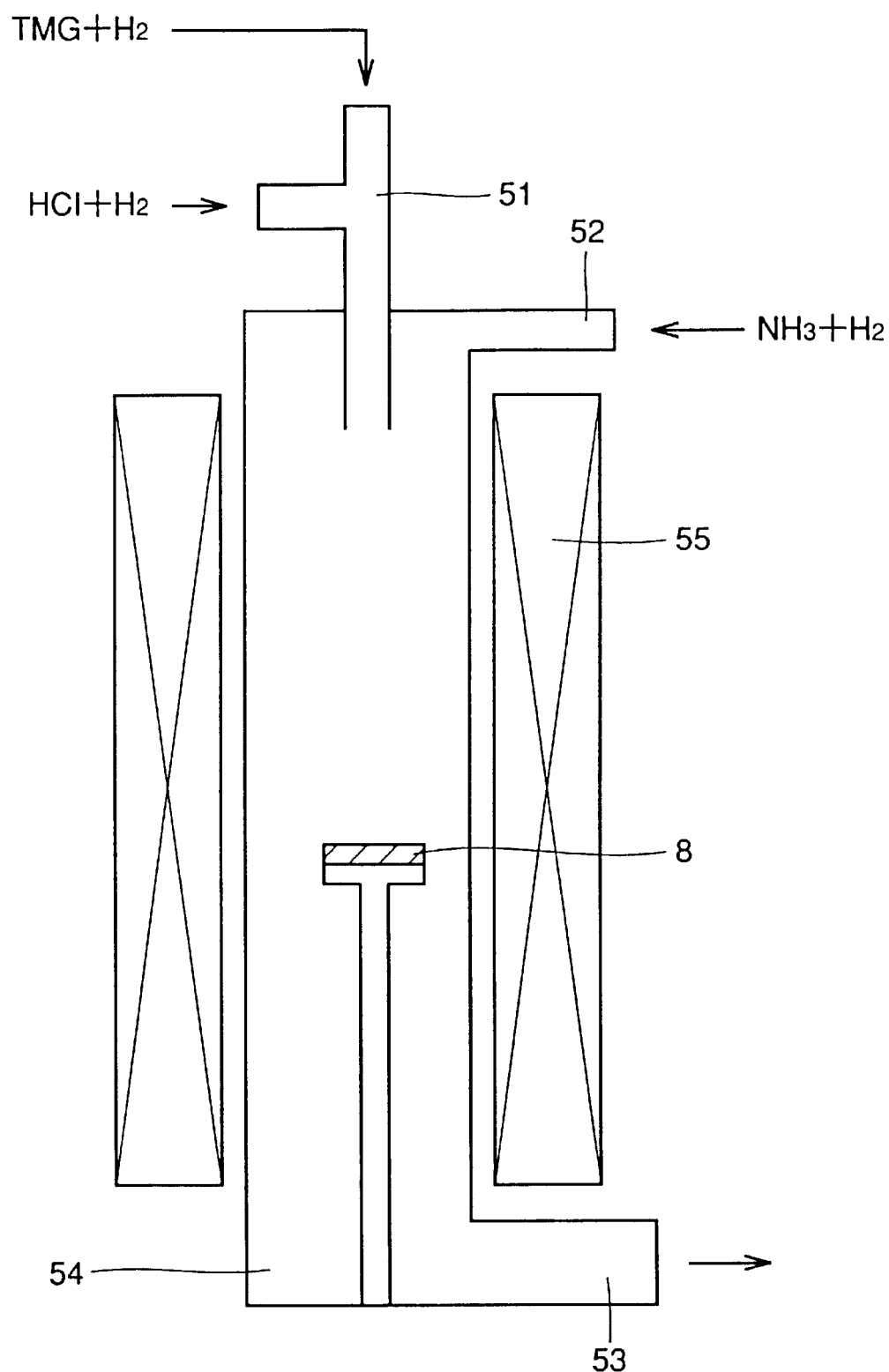
FIG. 6 schematically illustrates the structure of a vapor deposition device employed for forming a compound semiconductor epitaxial layer according to the present invention.

With reference to FIGS. 2 and 6, a process of preparing an epitaxial semiconductor wafer employed for the light emitting device according to the first embodiment shown in FIGS. 1A and 1B is now described. First, a vapor deposition device employed for preparing the epitaxial wafer through metal-organic chloride vapor phase epitaxy (MOCVPE) is described with reference to FIG. 6. This device is formed by a reaction chamber 54 having first and second gas inlet ports 51 and 52 and an exhaust port 53, and a resistance heater 55 for heating the overall reaction chamber 54 from its exterior. The epitaxial wafer shown in FIG. 2 is prepared using such a device. In more concrete terms, a GaAs (111) A-plane substrate 8 pretreated with an etching solution of hydrogen chloride (HCl) is set in the reaction chamber 54 consisting of quartz. The term "GaAs (111) A-plane substrate" indicates a substrate having a Ga surface on a GaAs (111) plane.

Then, the overall reaction chamber 54 is heated from the exterior using the resistance heater 55, for holding the substrate 8 at 500° C. In this state, trimethyl gallium (TMG) and hydrogen chloride (HCl) are introduced from the first gas inlet port 51 as group III raw materials at partial pressures of $8\times10^{-4}$ atm. and $8\times10^{-4}$ atm. respectively. On the other hand, ammonia gas ($NH_3$) is introduced from the second gas inlet port 52 as a group V raw material at a partial pressure of $5.6\times10^{-1}$ atm. Epitaxy is achieved for 15 minutes under such conditions, for forming a GaN buffer layer 1 having a thickness of 30 nm on the GaAs substrate 8.

Thereafter the resistance heater 55 heats the GaAs substrate 8 provided with the GaN buffer layer 1, for increasing its temperature to 850° C. Then, the partial pressures for TMG, HCl and $NH_3$ are set at $8\times10^{-4}$ atm., $8\times10^{-4}$ atm. and $1.6\times10^{-1}$ atm. respectively, for achieving epitaxy for 100 minutes under such conditions. Thus, a hexagonal n-type GaN epitaxial layer 2 is formed on the GaN buffer layer 1.

Then, the temperature of the GaAs substrate 8 is maintained at 800 to 850° C. with the resistance heater 55, and TMG, trimethyl aluminum (TMA), HCl and $NH_3$ are introduced under conditions equalizing partial pressures for TMG and TMA with each other, for achieving epitaxy for 10 minutes. Thus formed is an epitaxial layer 3 consisting of n-type $Al_{0.1}Ga_{0.9}N$.

Then, the temperature of the GaAs substrate 8 is reduced to the range of 500 to 700° C. with the resistance heater 55. Thereafter TMG, trimethyl indium (TMI), HCl and $NH_3$ are introduced under such conditions that the partial pressure for TMI is 20 times that for TMG, for achieving epitaxy for 10 minutes. Thus formed is a luminescent layer 4 consisting of $In_{0.3}Ga_{0.7}N$.

Then, the conditions are returned to those for forming the epitaxial layer 3 consisting of n-type $Al_{0.1}Ga_{0.9}N$ as described above, for now forming an epitaxial layer 5 consisting of p-type $Al_{0.1}Ga_{0.9}N$ similarly to the above. The epitaxial layers 3 and 5 serve as cladding layers holding the luminescent layer 4 therebetween.

A p-type GaN epitaxial layer 6 is grown on the p-type AlGaN epitaxial layer 5 under the same conditions as those for forming the n-type GaN epitaxial layer 2. Dopants introduced into the n- and p-type GaN layers 2 and 6 are prepared from silicon (Si) or sulfur (S) and magnesium (Mg) respectively. The InGaN luminescent layer 4 is originally of an n-type. Epitaxy is completed at this point in time, and the substrate 8 is temporarily taken out from the furnace. Then, a surface of the GaAs substrate 8 which is opposite to that provided with the epitaxial layers is ground using a grinder. Due to this grinding, the thickness of the GaAs substrate 8, which is originally 600 µm, is reduced to about 100 µm.

Thereafter $SiO_2$ films each having a thickness of 300 nm are formed on upper and lower surfaces respectively by plasma chemical vapor deposition (plasma CVD). Then, the $SiO_2$ films are patterned through photolithography. The patterned $SiO_2$ films are employed for masking.

In more concrete terms, a portion of the GaAs substrate 8 not masked with the $SiO_2$ films is removed by a reactive etching device (not shown). The reactive etching device is generally provided with a flat electrode which is connected with a high-frequency power source and a counter electrode opposed to the flat electrode. This reactive etching device comprises a gas inlet system for introducing a reactive gas and an exhaust system for maintaining the pressure in an etching chamber at a constant level. In case of carrying out etching, the wafer is arranged on the flat electrode to which high-frequency power is applied, and a plasma is generated between the flat and counter electrodes. Ions of the reactive gas are vertically incident upon the wafer surface along a vertical electric field across the electrodes, for etching the wafer surface in the vertical direction. In this case, $Cl_2$ gas is fed as the reactive gas. The total pressure and the high-frequency power (frequency: 13.56 MHz) for generating the plasma are set at $1.3\times10^{-3}$ atm. and 150 W respectively, for etching the GaAs substrate 8.

Thus, the GaAs substrate 8 is partially removed by the reactive ion etching device through the masks of the $SiO_2$ films. Thereafter the $SiO_2$ films are removed and an ohmic metal electrode 7b is vapor-deposited on a surface of the portion of the GaAs substrate 8 from which the $SiO_2$ films have been removed. At the same time, a metal electrode 7a is vapor-deposited also on a surface of the p-type GaN epitaxial layer 6. Thus prepared is a double hetero light emitting device according to the first embodiment, as shown in FIGS. 1A and 1B.

(Second Embodiment)

Figure 3:
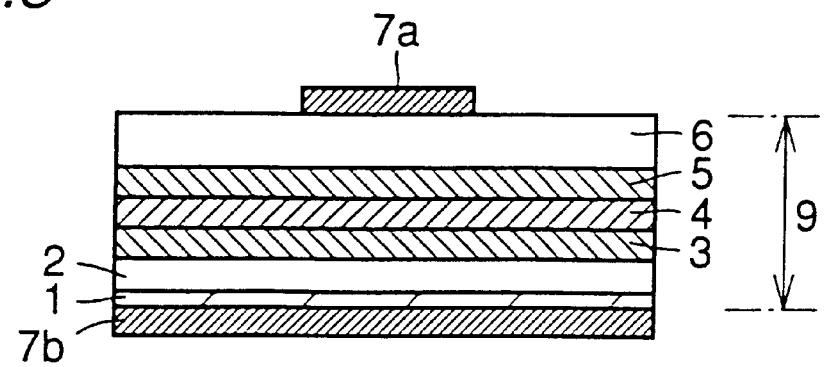
FIG. 3 is a sectional view showing the light emitting device according to the second embodiment of the present invention.

With reference to FIGS. 2 and 3, a light emitting device according to a second embodiment of the present invention is now described. In the structure of the light emitting device according to the second embodiment, a GaAs substrate 8 is completely removed as shown in FIG. 3, dissimilarly to the light emitting device according to the first embodiment shown in FIG. 1A. In more concrete terms, a metal electrode 7b is directly formed on a rear surface of a nitride mixed crystal layer 9, and a metal electrode 7a is also formed on a prescribed portion of an upper surface of the nitride mixed crystal layer 9.

In the light emitting device according to the second embodiment, the nitride mixed crystal layer 9 includes six layers of a GaN buffer layer 1, an n-type GaN epitaxial layer 2, an n-type AlGaN epitaxial layer 3, an InGaN luminescent layer 4, a p-type AlGaN epitaxial layer 5 and a p-type GaN epitaxial layer 6, similarly to the structure of the light emitting device according to the first embodiment shown in FIG. 1A. In the light emitting device according to the second embodiment shown in FIG. 3, however, the GaAs substrate 8 is completely removed dissimilarly to the light emitting device according to the first embodiment, and hence the strength of the nitride mixed crystal layer 9 must be increased. In the light emitting device according to the second embodiment, therefore, the thickness of the nitride mixed crystal layer 9 is preferably set to be at least 70 µm and not more than 200 µm. The nitride mixed crystal layer 9 is weak in strength if the thickness is less than 70 µm, while the cost is excessively increased if the thickness is larger than 200 µm.

Except the GaN epitaxial layers 2 and 6, each layer forming the nitride mixed crystal layer 9 has an extremely small thickness of 0.1 to 0.2 µm. In practice, therefore, the thickness of the nitride mixed crystal layer 9 is substantially identical to the total thickness of the GaN epitaxial layers 2 and 6. In order to increase the thickness of the nitride mixed crystal layer 9, therefore, it is effective to increase the thicknesses of the GaN epitaxial layers 2 and 6. The thicknesses of the n- and p-type AlGaN epitaxial layers 3 and 5 serving as cladding layers for holding the InGaN luminescent layer 4 therebetween may also be effectively increased for increasing the strength.

In the light emitting device according to the second embodiment shown in FIG. 3, light absorption by GaAs can be prevented in light emission by completely removing the GaAs substrate 8. Consequently, it is possible to provide a light emitting device having higher luminance as compared with that according to the first embodiment.

A process of preparing the light emitting device according to the second embodiment shown in FIG. 3 is now described. Similarly to the aforementioned process of preparing the light emitting device according to the first embodiment, a GaN buffer layer 1 is formed on a GaAs (111) A-plane substrate 8, as shown in FIG. 2. The GaN buffer layer 1 has an extremely small thickness of not more than 1 μm. Therefore, the GaN buffer layer 1 does not much contribute to the thickness of the nitride mixed crystal layer 9. Then, the temperature of the GaAs substrate 8 provided with the GaN buffer layer 1 is increased to 850° C. with a resistance heater 55. Thereafter partial pressures for TMG, HCl and $NH_3$ are set at $8 \times 10^{-4}$ atm., $8 \times 10^{-4}$ atm. and $1.6 \times 10^{-1}$ atm. respectively, for achieving epitaxy under such conditions. Thus formed is a hexagonal n-type GaN epitaxial layer 2 having a thickness of about 40 μm.

Then, the temperature of the GaAs substrate 8 is maintained at 800 to 850° C. with the resistance heater 55. Then, TMG, TMA, HCl and $NH_3$ are introduced under conditions equalizing partial pressures for TMG and TMA with each other. Epitaxy is achieved for 10 minutes in this state. Consequently formed is an epitaxial layer 3 consisting of n-type $Al_{0.1}Ga_{0.9}N$.

Then, the temperature of the GaAs substrate 8 is reduced to the range of 500 to 700° C. with the resistance heater 55. Thereafter TMG, TMI, HCl and $NH_3$ are introduced under such conditions that the partial pressure for TMI is 20 times that for TMG, for achieving epitaxy for 10 minutes. Thus formed is a luminescent layer 4 consisting of $In_{0.3}Ga_{0.7}N$.

Thereafter the conditions are returned to those for forming the epitaxial layer 3 consisting of n-type $Al_{0.1}Ga_{0.9}N$ as described above, for now forming an epitaxial layer 5 consisting of p-type $Al_{0.1}Ga_{0.9}N$ similarly to the above. The n- and p-type epitaxial layers 3 and 5 serve as cladding layers holding the luminescent layer 4.

A p-type GaN epitaxial layer 6 is grown on the p-type AlGaN epitaxial layer 5 under conditions similar to those for forming the n-type GaN epitaxial layer 2. Epitaxy is completed in this stage, and the GaAs substrate 8 is temporarily taken out from the furnace. Then, a surface of the GaAs substrate 8 which is opposite to that provided with the epitaxial layers is ground using a grinder. Due to this grinding, the thickness of the GaAs substrate 8, which is originally 600 μm, is reduced to about 100 μm.

Thereafter the GaAs substrate 8 is set in a furnace dedicated to etching. In this etching furnace, hydrogen gas is employed as a carrier gas for feeding 10 sccm of hydrogen chloride under a normal pressure at a substrate temperature of 800° C. Thus, the GaAs substrate 8 is entirely removed by etching through thermal decomposition with no plasma. "10 sccm" indicates a flow rate of 10 cc per minute at 0° C. and 1 atm.

Thus, the GaAs substrate 8 is removed by etching, thereby forming an epitaxial wafer consisting of only the nitride mixed crystal layer 9. When the GaAs substrate 8 is removed in the aforementioned manner, the etching time can be reduced by previously reducing the thickness of the GaAs substrate 8 to about 100 μm with a grinder as described above and thereafter performing etching. Thus, damage of the nitride mixed crystal layer 9 caused by the etching can be reduced.

Then, ohmic metal electrodes 7 are vapor-deposited on upper and lower surfaces of the nitride mixed crystal layer 9 respectively, and the epitaxial wafer is cut into the size of a light emitting device. Thus, it is possible to prepare a double hetero light emitting device according to the second embodiment having the AlGaN epitaxial layers 3 and 5 serving as cladding layers, as shown in FIG. 3. The overall thickness of the nitride mixed crystal layer 9 shown in FIG. 3 is set at about 200 μm. Thus, it is possible to provide a light emitting device which is stable in strength.

The GaAs substrate 8 may conceivably be removed by reactive ion etching. In more concrete terms, the wafer for the light emitting device is formed in the state shown in FIG. 2, and thereafter set in a reactive ion etching device. In the reactive etching device, $Cl_2$ gas is fed as a reactive gas, and the total pressure and high-frequency power for generating a plasma are set at $1.3 \times 10^{-3}$ atm. and 150 W at 13.56 MHz respectively, for etching the GaAs substrate 8. Thereafter the ohmic metal electrodes 7a and 7b are vapor-deposited on the upper and lower surfaces of the GaAs substrate 8 respectively, as shown in FIG. 3. Then, the epitaxial wafer is cut into the size of the light emitting device, thereby forming the double hetero light emitting device.

An effect similar to the above can be attained also with a mixed gas of $Cl_2$ and $H_2$ for the reactive ion etching. In this case, etching can be effectively performed with a gas total pressure of $1.3 \times 10^{-4}$ atm. and high-frequency power of 50 to 300 W at 13.56 MHz for generating the plasma.

(Third Embodiment)

A light emitting device according to a third embodiment of the present invention is now described with reference to FIGS. 4 and 5. Referring to FIG. 5, a nitride mixed crystal layer 9 is formed by four layers of a GaN buffer layer 1, an n-type GaN epitaxial layer 2, an InGaN luminescent layer 4 and a p-type GaN epitaxial layer 6 in the light emitting device according to the third embodiment, dissimilarly to those according to the first and second embodiments. Metal electrodes 7a and 7b are formed on upper and lower surfaces of such a nitride mixed crystal layer 9 respectively. Also in the light emitting device according to the third embodiment, a GaAs substrate 8 is completely removed in a process described later, so that no light is absorbed by the GaAs substrate 8. Thus, it is possible to provide a light emitting device having higher luminance as compared with that according to the first embodiment shown in FIG. 1A. The thickness of the nitride mixed crystal layer 9 is set at about 70 μm in the third embodiment.

A process of preparing the light emitting device according to the third embodiment is now described with reference to FIGS. 4 and 5.

Figure 4:
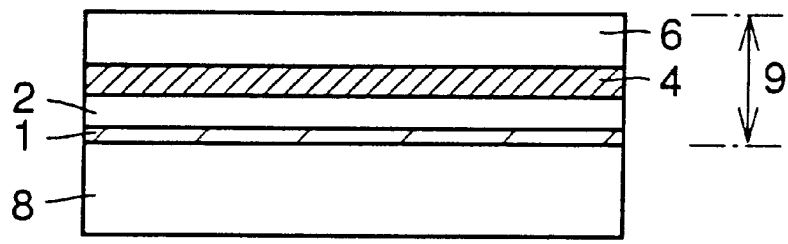
FIG. 4 is a sectional view for illustrating a process of preparing an epitaxial wafer employed for a light emitting device according to a third embodiment of the present invention.
Figure 5:
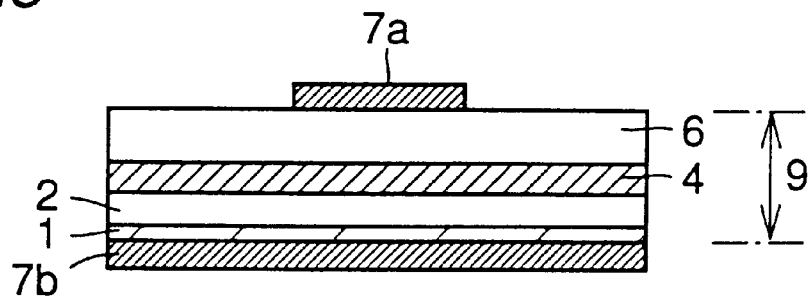
FIG. 5 is a sectional view showing the light emitting device according to the third embodiment of the present invention.

First, an epitaxial wafer shown in FIG. 4 is formed with the vapor deposition device shown in FIG. 6 described above with reference to the process according to the first embodiment. In more concrete terms, a GaAs (111) A-plane substrate 8 pretreated with an etching solution of hydrogen chloride (HCl) is set in the reaction chamber 54 consisting of quartz, as shown in FIG. 6.

Then, the overall reaction chamber 54 is heated from the exterior using a resistance heater 55, for maintaining the temperature of the GaAs substrate 8 at 500° C. In this state, trimethyl gallium (TMG) and hydrogen chloride (HCl) are introduced from the first gas inlet port 51 as group III raw materials at partial pressures of $8 \times 10^{-4}$ atm. and $8 \times 10^{-4}$ atm. respectively. On the other hand, ammonia gas ($NH_3$) is introduced from the second gas inlet port 52 as a group V raw material at a partial pressure of $5.6 \times 10^{-1}$ atm. Epitaxy is achieved for 15 minutes under such conditions, for forming a GaN buffer layer 1 having a thickness of 30 nm on a surface of the GaAs substrate 8.

Thereafter the resistance heater 55 heats the GaAs substrate 8 provided with the GaN buffer layer 1, for increasing its temperature to 850° C. Thereafter the partial pressures for TMG, HCl and $NH_3$ are set at $8 \times 10^{-4}$ atm., $8 \times 10^{-4}$ atm. and $1.6 \times 10^{-1}$ atm. respectively, for achieving epitaxy for 100 minutes under such conditions. Thus, a hexagonal n-type GaN epitaxial layer 2 having a thickness of 5 μm is grown on the GaN buffer layer 1.

Then, the temperature of the GaAs substrate 8 provided with the GaN buffer layer 1 and the n-type epitaxial layer 2 is reduced to the range of 500 to 700° C. with the resistance heater 55. Thereafter TMG, TMI, HCl and $NH_3$ are introduced under such conditions that the partial pressure for TMI is 10 times that for TMG, for achieving epitaxy for 10 minutes. Thus formed is a luminescent layer 4 consisting of $In_{0.3}Ga_{0.7}N$.

Then, a p-type GaN epitaxial layer 6 is formed under the same conditions as those for forming the n-type GaN epitaxial layer 2. Thus, the epitaxial wafer for the light emitting device is formed as shown in FIG. 4.

Thereafter the epitaxial wafer for the light emitting device is taken out and set in a furnace dedicated to etching. In this etching furnace, hydrogen ($H_2$) gas is employed as a carrier gas for feeding 10 sccm of HCl under a normal pressure at a substrate temperature of 800° C. Thus, the GaAs substrate 8 is completely removed by etching. Consequently formed is the epitaxial wafer consisting of the nitride mixed crystal layer 9, from which the GaAs substrate 8 has been completely removed.

Thereafter ohmic metal electrodes 7a and 7b are vapor-deposited on upper and lower surfaces of such an epitaxial wafer respectively. Then, the epitaxial wafer is cut into the size of the light emitting device. Thus formed is a double hetero light emitting device according to the third embodiment, having the InGaN luminescent layer 4 held between the n- and p-type GaN epitaxial layers 2 and 6, as shown in FIG. 5. In this case, the nitride mixed crystal layer 9 is not very strong due to its thickness of about 70 $\mu$m. When a current was fed to a double hetero light emitting device according to the third embodiment formed in the aforementioned manner in practice, however, it was confirmed that it was possible to obtain blue light emission which was brighter than that in the light emitting device employing the GaAs substrate 8.

This light emission is weak with a small energy gap between the n- and p-type GaN epitaxial layers 2 and 6 serving as cladding layers and the luminescent layer 4. However, blue light emission is conceivably obtained due to complete removal of the GaAs substrate 8 absorbing light.

(Fourth Embodiment)

According to a fourth embodiment of the present invention, a GaAs (111) A-plane substrate 8 is first pretreated, and thereafter set in the reaction chamber 54 shown in FIG. 6. Then, the GaAs (111) A-plane substrate 8 is heated using the resistance heater 55, so that its temperature is maintained at 500° C. In this state, trimethyl gallium (TMG) and hydrogen chloride (HCl) are introduced from the first gas inlet port 51 at partial pressures of $8\times10^{-4}$ atm. and $8\times10^{-4}$ atm. respectively. On the other hand, ammonia gas ($NH_3$) is introduced from the second gas inlet port 52 at a partial pressure of $5\times10^{-1}$ atm. Under such conditions, a GaN buffer layer of about 30 nm is grown on the GaAs substrate 8 for 15 minutes. Further, the GaAs substrate 8 is heated using the resistance heater 55, so that its temperature is increased to 920° C. Thereafter the partial pressures for TMG, HCl and $NH_3$ are set at $2\times10^{-3}$ atm., $2\times10^{-3}$ atm. and $2\times10^{-3}$ atm. respectively, for achieving epitaxy for 10 hours. Consequently, a GaN epitaxial layer of about 100 $\mu$m is grown on the GaN buffer layer. While cracks were found in such a GaN epitaxial layer prepared in practice, it was confirmed by X-ray crystallographic analysis that this GaN epitaxial layer was a single-crystalline thick film of hexagonal GaN having a mirror surface.

Then, wet etching is performed for about 30 minutes in an etchant containing hydrogen peroxide water and ammonia at a volume ratio of 2:1, for entirely removing the GaAs substrate 8. Thus, a GaN substrate consisting of the GaN buffer layer and the GaN epitaxial layer can be prepared. This GaN substrate can be used for various applications as a simple substance.

For example, this GaN substrate is effective as a substrate for a laser diode. In this GaN substrate having no substrate of another type under the GaN layer, a reflecting surface formed by cleavage on a chip end surface of a laser unit can be extremely smoothed, for remarkably improving the laser characteristics.

In a similar method to that according to the first embodiment, hetero epitaxy was carried out on a GaN substrate prepared in the aforementioned manner in practice. First, each of $NH_3$, TMG and TMA was introduced onto a GaN epitaxial layer forming the GaN substrate at a pressure of about about $1.6\times10^{-1}$ atm., and grown at 850° C. for about 10 minutes, thereby forming an AlGaN layer. Thereafter TMI and TMG were fed at partial pressures of $4\times10^{-4}$ atm. and $2\times10^{-5}$ atm. respectively at 800° C. with $NH_3$ in the same flow rate as the above, thereby forming an epitaxial layer consisting of InGaN on the AlGaN layer. Further, another AlGaN layer was grown on the InGaN epitaxial layer in the same conditions as those for growing the aforementioned AlGaN layer. Thus, it was possible to form a double heterostructure on the GaN substrate. Then, a rear side of the GaN substrate was scribed with a diamond pen, for cleaving the same. Consequently, a mirror-faced cleavage plane was obtained, and it was confirmed that this laser diode was sufficient in flatness and parallelism for serving as a reflector.

A laser diode is generally provided with a reflector on an end surface of a substrate, to be based on end plane emission. It is said that cleavage of the substrate, i.e. flatness of the end plane, decides the characteristics of the laser diode. When a general sapphire substrate is employed, cleavage cannot be satisfactorily achieved due to the difference between cleavage planes of the sapphire substrate and GaN. According to the present invention, both the substrate and the epitaxial layer are of a GaN system because no substrate other than the GaN substrate, is present to enable remarkably preferable cleavage.

The GaN substrate consisting of the GaN buffer layer and the GaN epitaxial layer is preferably formed to have a thickness of at least 70 $\mu$m and not more than 400 $\mu$m. The upper limit is increased up to 400 $\mu$m, since a large thickness is preferable for employment as a single substrate.

(Fifth Embodiment)

According to a fifth embodiment of the present invention, a thin film of $SiO_2$ as an insulating film is first formed on a GaAs (111) A-plane substrate 8 in a thickness of about 100 nm by reactive sputtering. Thereafter a stripe resist pattern of about 5 $\mu$m in width is formed on the insulating $SiO_2$ film by photolithography. Thereafter the resist pattern is employed as a mask for removing portions of the $SiO_2$ film exposed through stripe windows of the resist pattern by reactive ion etching (RIE). Thereafter the resist pattern is removed, thereby preparing a GaAs (111) A-plane substrate 8 having a stripe pattern, consisting of $SiO_2$, having a thickness of about 100 nm at pitches of about 5 $\mu$m.

Thereafter GaN is grown on the GaAs (111) A-plane substrate 8, similarly to the aforementioned embodiments. In more concrete terms, the GaAs (111) A-plane substrate 8 is pretreated with an HCl etching solution, and thereafter set in the reaction chamber 54. The GaAs (111) A-plane substrate 8 is heated using the resistance heater 55, so that its temperature is maintained at about 500° C., similarly to the aforementioned embodiments. In this state, trimethyl gallium (TMG) and hydrogen chloride are introduced from the first gas inlet port 51 at partial pressures of $8 \times 10^{-4}$ atm. and $8 \times 10^{-4}$ atm. respectively. On the other hand, ammonia gas ($NH_3$) is introduced from the second gas inlet port 52 at a partial pressure of $5 \times 10^{-1}$ atm. Under such conditions, a GaN buffer layer of about 30 nm is grown on the GaAs (ill) A-plane substrate 8 for 15 minutes. Further, the GaAs (111) A-plane substrate 8 is heated with the resistance heater 55, so that its temperature is increased to 920° C. Thereafter the partial pressures for TMG, HCl and $NH_3$ are set at $2 \times 10^{-3}$ atm., $2 \times 10^{-3}$ atm. and $2 \times 10^{-1}$ atm. respectively, for achieving epitaxy for 10 hours. Consequently, a GaN epitaxial layer of about 100 μm is grown on the GaN buffer layer.

In an initial stage of the growth, the GaN epitaxial layer is not in the least grown on the $SiO_2$ film but selectively grown only on the GaAs (111) A-plane substrate 8. With progress of the growth, however, the thickness of the GaN epitaxial layer is increased, followed by lateral growth of the GaN epitaxial layer on the $SiO_2$ film. Thus, portions of the GaN epitaxial layer grown on the $SiO_2$ film from both sides are connected and integrated with each other. In practice, it has been confirmed by X-ray crystallographic analysis that a GaN epitaxial layer having a thickness of about 100 μm formed in the aforementioned manner was a hexagonal single-crystalline thick film having a mirror surface with no cracks.

Figure 7:
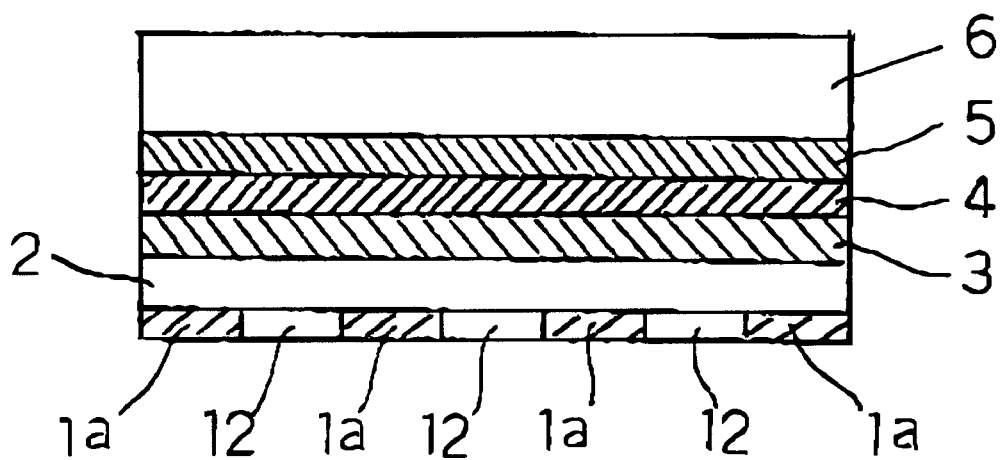
FIG. 7 is a sectional view showing a light emitting device according to a fifth embodiment of the present invention.

Then, wet etching is performed for about 30 minutes in an etchant containing hydrogen peroxide water and ammonia at a ratio of 2:1, for entirely removing the GaAs (111) A-plane substrate 8. Thus, a GaN substrate consisting of the GaN buffer layer comprising buffer layer stripes 1a arranged between insulating stripes 12, as well as the GaN epitaxial layer 2 can be prepared in a thickness of about 100 μm, as shown in FIG. 7. This GaN substrate can be used for various applications as a simple substrate. For example, this GaN substrate is effective as a substrate for a laser diode. In this GaN substrate having no substrate of another type under the GaN layer, a reflecting surface formed by cleavage on a chip end surface of a laser unit can be extremely smoothed, for remarkably improving the laser characteristics.

In practice, hetero epitaxy was carried out on a GaN substrate prepared in the aforementioned manner similarly to the first embodiment, to prepare a structure as shown in FIG. 7. First, $NH_3$ and each of TMG and TMA were introduced onto a GaN epitaxial layer 2 of the GaN substrate at partial pressures of $1.6 \times 10^{-1}$ atm. and about $6 \times 10^{-4}$ atm. respectively, and grown at 850° C. for about 10 minutes, thereby forming an AlGaN layer 3. Thereafter TMI and TMG were fed at partial pressures of $4 \times 10^{-4}$ atm. and $2 \times 10^{-5}$ atm. respectively at 800° C. with $NH_3$ in the same flow rate as the above, thereby forming an epitaxial layer 4 consisting of InGaN on the AlGaN layer 3. Further, another AlGaN layer 5 was grown on the InGaN epitaxial layer 4 in the same conditions as those for growing the aforementioned AlGaN layer 3. Finally, an upper GaN layer 6 was formed on the second AlGaN layer 5, also similarly to the first embodiment. Thus, it was possible to form a double heterostructure on the GaN substrate. Then, a rear side of the GaN substrate was scribed with a diamond pen, for cleaving the same. Consequently, a mirror-faced cleavage plane was obtained, and it was confirmed that this laser diode was sufficient in flatness and parallelism for serving as a reflector.

While the three-system AlGaN epitaxial layers 3 and 5 of Ga, Al and N are employed as cladding layers in each of the aforementioned first and second embodiments, the present invention is not restricted to this but instead four-system epitaxial layers of Ga, Al, In and N can be employed as cladding layers. The InGaN luminescent layer 4 conceivably emits light since such three- or four-system cladding layers have larger energy band gaps as compared with the InGaN luminescent layer.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A wafer for a light emitting device comprising a GaN substrate including a stripe patterned insulating film, a GaN buffer layer and a GaN epitaxial layer, wherein said stripe patterned insulating film comprises a plurality of mutually spaced apart first stripes, said GaN buffer layer is disposed as second stripes arranged in spaces between said first stripes, and said GaN epitaxial layer is disposed on and covering said first stripes and said second stripes.

2. A blue or blue-green light emitting device comprising:
    an insulating film comprising insulating film stripes arranged adjacent and spaced apart from one another to form a stripe pattern of said stripes; and
    a gallium nitride compound layer;
    wherein said gallium nitride compound layer includes: a GaN buffer layer comprising GaN buffer layer stripes arranged between said insulating film stripes; a first GaN epitaxial layer; a first AlGaN epitaxial layer; a blue or blue-green luminescing layer containing InGaN; a second AlGaN epitaxial layer; and a second GaN epitaxial layer.

3. The light emitting device in accordance with claim 2, wherein
    said gallium nitride compound layer has a thickness of at least 1 μm and not more than 70 μm.

4. The wafer in accordance with claim 1, wherein said insulating film consists essentially of $SiO_2$.

5. The wafer in accordance with claim 1, wherein said insulating film consists essentially of SiN.

6. The wafer in accordance with claim 1, wherein said first stripes each have a thickness of about 100 nm and a width of about 5 μm.

7. The wafer in accordance with claim 6, wherein said first stripes are adjacently spaced from one another by about 5 μm.

8. The wafer in accordance with claim 1, wherein said first stripes each have a thickness in a range from 0.05 um to 0.5 μm, and a width in a range from 3 μm to 20 μm.

9. The wafer in accordance with claim 8, wherein said GaN buffer layer has a thickness of about 30 nm, and said GaN epitaxial layer has a thickness of about 100 μm.

10. The wafer in accordance with claim 1, wherein said GaN buffer layer has a lesser thickness than does said insulating film.

11. The wafer in accordance with claim 10, further comprising a first AlGaN layer disposed on said GaN substrate, an InGaN layer disposed on said first AlGaN layer, and a second AlGaN layer disposed on said InGaN layer.

12. The wafer in accordance with claim 10, further comprising a GaAs substrate on a portion of a surface of said GaN substrate opposite said GaN epitaxial layer.

13. The light emitting device in accordance with claim 2, wherein said insulating film consists essentially of $SiO_2$.

14. The light emitting device in accordance with claim 2, wherein said insulating film consists essentially of SiN.

15. The light emitting device in accordance with claim 2, wherein said insulating film each have a thickness of about 100 nm and a width of about 5 μm.

16. The light emitting device in accordance with claim 15, wherein said insulating film stripes are adjacently spaced from one another by about 5 μm.

17. The light emitting device in accordance with claim 2, wherein said insulating film stripes each have a thickness in a range from 0.05 μm to 0.5 μm, and a width in a range from 3 μm to 20 μm.

18. The light emitting device in accordance with claim 17, wherein said GaN buffer layer has a thickness of about 30 nm, and said first GaN epitaxial layer has a thickness of about 100 μm.

19. The light emitting device in accordance with claim 2, wherein said GaN buffer layer has a lesser thickness than does said insulating film, and said first GaN epitaxial layer is disposed on and covering said insulating film stripes and said GaN buffer layer stripes.

\* \* \* \* \*

UNITED STATES PATENT AND TRADEMARK OFFICE
CERTIFICATE OF CORRECTION

PATENT NO. : 5,962,875
DATED : Oct. 5, 1999
INVENTOR(S) : Motoki et al.

It is certified that error appears in the above-identified patent and that said Letters Patent is hereby corrected as shown below:

Col. 11, line 8, after "GaAs", replace "(i11)", by --(111)--;

Col. 13, line 4, after "film" insert --stripes--.

Signed and Sealed this

Ninth Day of May, 2000

Attest:

Attesting Officer

Q. TODD DICKINSON
Director of Patents and Trademarks